(12) United States Patent
Tsuto

(10) Patent No.: US 6,601,204 B1
(45) Date of Patent: Jul. 29, 2003

(54) PATTERN GENERATING METHOD, PATTERN GENERATOR USING THE METHOD, AND MEMORY TESTER USING THE PATTERN GENERATOR

(75) Inventor: Masaru Tsuto, Tokyo (JP)

(73) Assignee: Advantest Corporation, Tokyo (JP)

( * ) Notice: Subject to any disclaimer, the term of this patent is extended or adjusted under 35 U.S.C. 154(b) by 420 days.

(21) Appl. No.: 09/717,715

(22) Filed: Nov. 21, 2000

(30) Foreign Application Priority Data

Nov. 26, 1999 (JP) ............................................ 11-335637

(51) Int. Cl.[7] .............................................. G01R 31/28
(52) U.S. Cl. ........................ 714/739; 714/738; 714/718
(58) Field of Search ................................ 714/719, 723, 714/718, 738, 739; 364/491; 365/201, 219

(56) References Cited

U.S. PATENT DOCUMENTS 4,369,511 A * 1/1983 Kimura et al. ............... 714/719
4,528,634 A * 7/1985 Nakahata et al. ............ 364/491
5,535,164 A * 7/1996 Adams et al. ............... 365/201
5,678,058 A * 10/1997 Sato ............................ 365/219
5,996,098 A * 11/1999 Takano ......................... 714/723

* cited by examiner

*Primary Examiner*—David Ton
(74) *Attorney, Agent, or Firm*—David N. Lathrop, Esq.; Gallagher & Lathrop

(57) ABSTRACT

After initializing a Direct Rambus DRAM under test with initialization data, an address, pattern data and mask data are provided to the memory to effect therein a byte-wise masked write of the pattern data, and parallel mask data is converted to plural pieces of serial mask data in accordance with burst addresses generated in a burst address generating means. Based on the bit logical value of each serial mask data, it is decided whether data of each byte is write-enabled or not in the byte-wise masked write, based on the bit logical value of each serial mask data and either one of the initialization data and the byte-wise masked written pattern data is selected to generate expectation data.

10 Claims, 14 Drawing Sheets

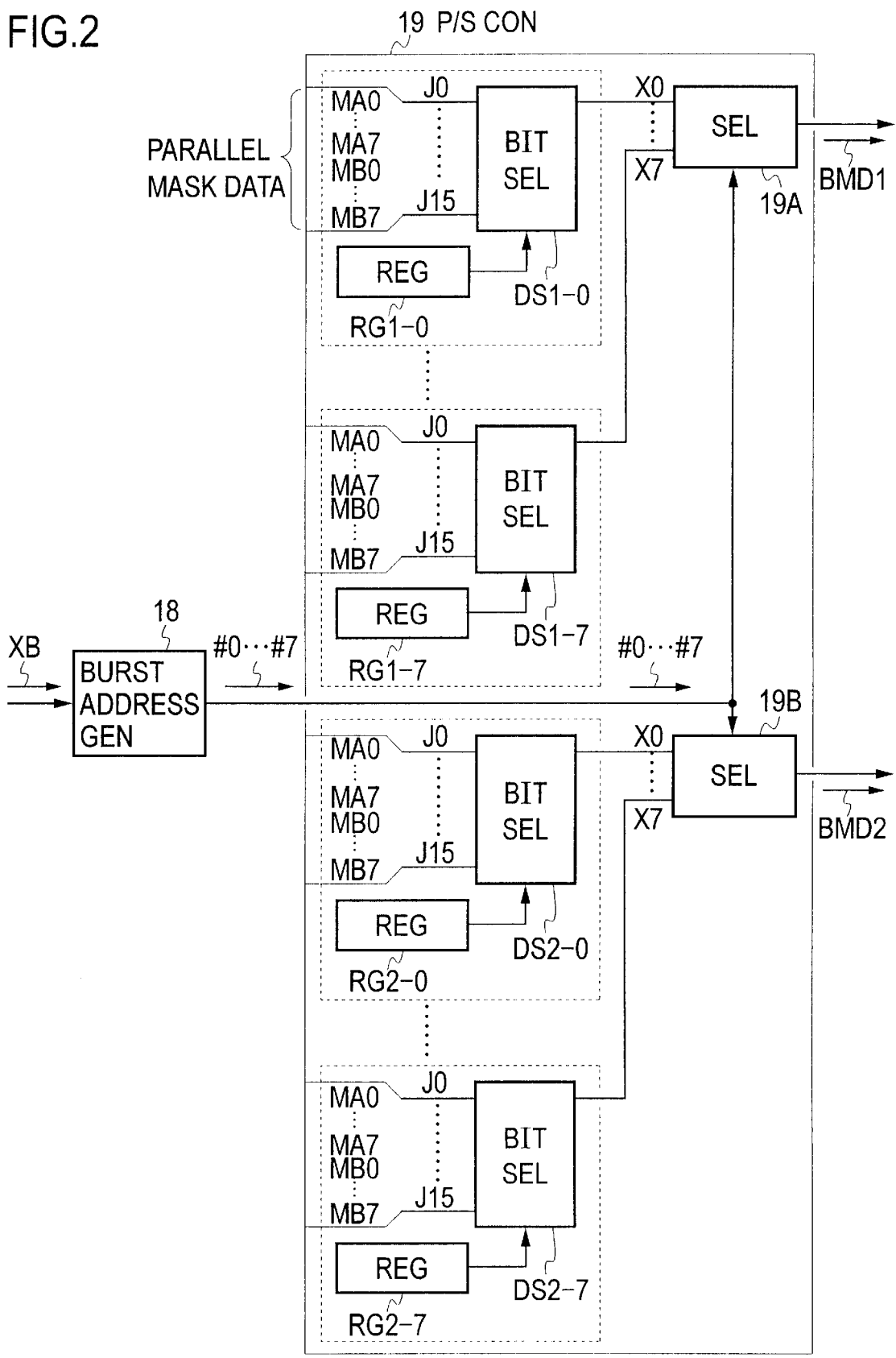

FIG.3

| | | COLC | | | | DQA/DQB | | | | | |
|---|---|---|---|---|---|---|---|---|---|---|---|
| | | | | | | | AA55 | | | | |
| MASK DATA | MD | Invalid | | | | | | | | | |
| ADDRESS | XB | #0 | #0 | #1 | #2 | #3 | #4 | #5 | #6 | #7 | |
| PTRN DATA | TP | Invalid | WDX0 (WDL0) (WDU0) | WDX1 (WDL1) (WDU1) | WDX2 (WDL2) (WDU2) | WDX3 (WDL3) (WDU3) | WDX4 (WDL4) (WDU4) | WDX5 (WDL5) (WDU5) | WDX6 (WDL6) (WDU6) | WDX7 (WDL7) (WDU7) | |
| | EXP-S | 0 | | | | | 1 | | | | |
| BURST ADDRESS | EA0-2 | Invalid | #0 | #1 | #2 | #3 | #4 | #5 | #6 | #7 | |
| SERIAL MASK DATA | BMD1 | Invalid | MA0 1 | MA1 0 | MA2 1 | MA3 0 | MA4 1 | MA5 0 | MA6 1 | MA7 0 | |
| | BMD2 | Invalid | MB0 0 | MB1 1 | MB2 0 | MB3 1 | MB4 0 | MB5 1 | MB6 0 | MB7 1 | |
| MASK DATA | MD | Invalid | | | | Invalid | | | | | |
| | XB | #0 | | | | Invalid | | | | | |
| EXPECTED VALUE | EXP | Invalid | WDL0 /WDU0 | WDL1 /WDU1 | WDL2 /WDU2 | WDL3 /WDU3 | WDL4 /WDU4 | WDL5 /WDU5 | WDL6 /WDU6 | WDL7 /WDU7 | |

FIG.8

| | | A | B | C | |
|---|---|---|---|---|---|
| | | INITIALIZATION W=1 | BIT MASK WRITING W=1 | READOUT R=1 | |
| PTRN GEN SIDE | XB | #0 | #0 | #0 | |
| | MD | 1111111111111111 | 1010101010101010 | 1010101010101010 | |
| | TP | 0000000000000000 | 1111111111111111 | 1111111111111111 | |
| | EXP-S | 0 | 0 | 1 | |
| MUT SIDE | XB | #0 | #0 | #0 | |
| | MD | 1111111111111111 | 1010101010101010 | Invalid | |
| | DT | 0000000000000000 | 1111111111111111 | 1010101010101010 | EXP |
| | DATA IN MUT | 0000000000000000 | 1010101010101010 | 1010101010101010 | RD |
| | | DATA WRITTEN FOR INITIALIZATION | DATA WRITTEN FOR BITWISE MASKING | | |

FIG.10

| PARALLEL MASK DATA → | MA0 | MA1 | MA2 | MA3 | MA4 | MA5 | MA6 | MA7 | |
|---|---|---|---|---|---|---|---|---|---|
| WRITE-IN DATA (ONE BYTE) | WA00 | WA01 | WA02 | WA03 | WA04 | WA05 | WA06 | WA07 | |
| | WA10 | WA11 | WA12 | WA13 | WA14 | WA15 | WA16 | WA17 | |
| | WA20 | WA21 | WA22 | WA23 | WA24 | WA25 | WA26 | WA27 | |
| | WA30 | WA31 | WA32 | WA33 | WA34 | WA35 | WA36 | WA37 | |
| | WA40 | WA41 | WA42 | WA43 | WA44 | WA45 | WA46 | WA47 | ← PARALLEL PATTERN DATA |
| | WA50 | WA51 | WA52 | WA53 | WA54 | WA55 | WA56 | WA57 | |
| | WA60 | WA61 | WA62 | WA63 | WA64 | WA65 | WA66 | WA67 | |
| | WA70 | WA71 | WA72 | WA73 | WA74 | WA75 | WA76 | WA77 | |
| | WA80 | WA81 | WA82 | WA83 | WA84 | WA85 | WA86 | WA87 | |
| PARALLEL MASK DATA → | MB0 | MB1 | MB2 | MB3 | MB4 | MB5 | MB6 | MB7 | |
| WRITE-IN DATA (ONE BYTE) | WB00 | WB01 | WB02 | WB03 | WB04 | WB05 | WB06 | WB07 | |
| | WB10 | WB11 | WB12 | WB13 | WB14 | WB15 | WB16 | WB17 | |
| | WB20 | WB21 | WB22 | WB23 | WB24 | WB25 | WB26 | WB27 | |
| | WB30 | WB31 | WB32 | WB33 | WB34 | WB35 | WB36 | WB37 | |
| | WB40 | WB41 | WB42 | WB43 | WB44 | WB45 | WB46 | WB47 | ← PARALLEL PATTERN DATA |
| | WB50 | WB51 | WB52 | WB53 | WB54 | WB55 | WB56 | WB57 | |
| | WB60 | WB61 | WB62 | WB63 | WB64 | WB65 | WB66 | WB67 | |
| | WB70 | WB71 | WB72 | WB73 | WB74 | WB75 | WB76 | WB77 | |
| | WB80 | WB81 | WB82 | WB83 | WB84 | WB85 | WB86 | WB87 | |
| BURST ADDRESS → | #0 | #1 | #2 | #3 | #4 | #5 | #6 | #7 | |

FIG.11

| | | PARALLEL CONT DATA | PARALLEL MASK DATA | DQA/DQB |
|---|---|---|---|---|
| PTRN GEN SIDE | MD | Invalid | FFFF | Invalid |
| | XB | #0 | Invalid | Invalid |
| | INITIALIZING DATA | Invalid | Invalid | PDx0 PDx1 PDx2 PDx3 PDx4 PDx5 PDx6 PDx7 |
| MUT SIDE | MD | Invalid | FFFF | Invalid |
| | XB | #0 | Invalid | Invalid |
| | DATA WRITTEN BY INITIALIZATION | Invalid | Invalid | PDx0 PDx1 PDx2 PDx3 PDx4 PDx5 PDx6 PDx7 |

FIG.12

| | | | | | | | | | |
|---|---|---|---|---|---|---|---|---|---|
| MASK DATA | | MA0 1 | MA1 1 | MA2 1 | MA3 1 | MA4 1 | MA5 1 | MA6 1 | MA7 1 |
| | | MB0 1 | MB1 1 | MB2 1 | MB3 1 | MB4 1 | MB5 1 | MB6 1 | MB7 1 |
| MUT | BURST ADDRESS | #0 | #1 | #2 | #3 | #4 | #5 | #6 | #7 |
| | DQA PIN SIDE | PDL0 | PDL1 | PDL2 | PDL3 | PDL4 | PDL5 | PDL6 | PDL7 |
| | DQB PIN SIDE | PDU0 | PDU1 | PDU2 | PDU3 | PDU4 | PDU5 | PDU6 | PDU7 |

FIG.13

| | PARALLEL CONT DATA | PARALLEL MASK DATA | DQA/DQB |
|---|---|---|---|
| MD | Invalid | AA55 | Invalid |
| XB | #0 | Invalid | Invalid |
| TP | Invalid | Invalid | WDx0 WDx1 WDx2 WDx3 WDx4 WDx5 WDx6 WDx7 |
| MD | Invalid | AA55 | Invalid |
| XB | #0 | Invalid | Invalid |
| DT | Invalid | Invalid | WDx0 WDx1 WDx2 WDx3 WDx4 WDx5 WDx6 WDx7 |

PTRN GEN SIDE (rows 1–3)
MUT SIDE (rows 4–6)

FIG.14

| MUT | MASK DATA | | MA0<br>1 | MA1<br>0 | MA2<br>1 | MA3<br>0 | MA4<br>1 | MA5<br>0 | MA6<br>1 | MA7<br>0 |
| --- | --- | --- | --- | --- | --- | --- | --- | --- | --- | --- |
| | | | MB0<br>0 | MB1<br>1 | MB2<br>0 | MB3<br>1 | MB4<br>0 | MB5<br>1 | MB6<br>0 | MB7<br>1 |
| | BURST ADDRESS | | 0 | 1 | 2 | 3 | 4 | 5 | 6 | 7 |
| | DQA PIN SIDE | | WDL0 | PDL1 | WDL2 | PDL3 | WDL4 | PDL5 | WDL6 | PDL7 |
| | DQB PIN SIDE | | PDU0 | WDU1 | PDU2 | WDU3 | PDU4 | WDU5 | PDU6 | WDU7 |

PATTERN GENERATING METHOD, PATTERN GENERATOR USING THE METHOD, AND MEMORY TESTER USING THE PATTERN GENERATOR

BACKGROUND OF THE INVENTION

The present invention relates to a memory tester for testing memories formed, for example, by semiconductor integrated circuits and, more particularly, to a pattern generating method for use in testing memories of the type that respond to a start address to generate burst addresses and hence permits fast write and read. The invention pertains as well to a pattern generator using the pattern generating method, and a memory tester using the pattern generator.

FIG. 6 illustrates in block form the general configuration of an IC tester. Reference character TES denotes generally the IC tester. The IC tester TES comprises a main controller 111, a pattern generator 112, a timing generator 113, a waveform formatter 114, a logic comparator 115, a driver 116, an analog comparator 117, a failure analysis memory 118, a logical amplitude reference voltage source 121, a comparison reference voltage source 122 and a device power source 123.

The main controller 111 is formed, in general, by a computer system and operates under the control of a test program prepared by a user, controlling the pattern generator 112 and the timing generator 113. The pattern generator 112 generates test pattern data DT, which is converted by the waveform formatter 114 to a test pattern signal of a waveform that meets specifications of a memory under test 119. The test pattern signal is provided to the driver 116 wherein It is voltage-amplified to a waveform having an amplitude value set in the logical amplitude reference voltage source 121. The test pattern signal thus voltage-amplified is then applied to the memory under test 119 for storage therein.

A response signal read out of the memory under test 119 is compared by the analog comparator 117 with a reference voltage fed from the reference voltage source 122 to decide whether the response signal has a predetermined logic level (voltage of a logic "H" or "L"). The response signal decided to be at the predetermined logic level is compared by the logic comparator 115 with expectation data EXP provided from the pattern generator 112. If a mismatch is found between the response signal and the expectation data EXP, it is decided that memory cell of the address from which the response signal was read out is failing, and upon each occurrence of such a failure, the faulty address is stored in the failure analysis memory 118 for use in deciding, after completion of the test, whether the failed cell is repairable.

FIG. 7 which is drafted by the present inventor, illustrates in block form the internal configuration of the pattern generator 112 which employs, for example, the expectation data generating method disclosed in Japanese Patent Application Laid-Open Gazette 08-036035 (Laid Open Feb. 6, 1996). The pattern generator 112 comprises: a program memory 11 in which there are stored microprograms for pattern generation use; a read address generating part 12 which determines an address for reading out the program memory 11; an address data generating part 13 which generates address data for input to the memory under test 119; a mask data generating part 15 which generates mask data MD for bitwise masking of test pattern data to be written into the memory under test 119; a pattern data generating part 15 which generates pattern data TP; an expectation data generating part 16 which generates from the pattern data TP and the mask data MD the expectation data EXP to be supplied to the logic comparator 115; and a multiplexer 17 which selects and outputs one of the pattern data TP from the pattern data generating part 15 and the expectation data EXP from the expectation data generating part 16.

Incidentally, the output from the multiplexer 17 will be identified by DT in the FIG. 7 example and the following description. Accordingly, DT is the pattern data DT at the write timing of the memory under test 119 and the expectation data EXP at the read timing.

The read address generating part 12 is composed of a program counter PC and a arithmetic logic unit ALU. The read address of the program memory 11 indicated by the program counter PC is subjected to an arithmetic operation, such as an addition or subtraction, based on an operation control instruction PC-C containing an operation value and written in the microprogram which is read out of the program memory 11 for the next test cycle, and the operation result is used to update the value of the program counter PC.

The address data generating part 13, the mask data generating part 14 and the pattern data generating part 1 5are each composed of an arithmetic logic unit ALU and a register RG. The values indicated by the registers RG, from which they are output as the address data XB, the mask data MD and the pattern data TP, respectively, are subjected to an arithmetic operation, such as an addition or subtraction, based on operation control instructions XB-C, MD-C and TP-C containing operation values and written in the microprograms which are read out of the program memory 11 for the next test cycle, and the operation results are used to update the values of the registers RG.

The address data XB and the pattern data TP are each converted by the waveform formatter 114 to a signal of a waveform that meets the specifications of the memory under test 119. Read/write control instruction R/W for the memory under test 119 is read out directly from the program memory 11, and is similarly converted by the waveform formatter 114 to a signal of a waveform that fulfills the specification of the memory under test 119, thereafter being input thereto.

Now, a description will be given of the mask data MD that is generated in the mask data generating part 14. Some memory devices have a bit-wise masked write function that inhibits a write for each bit of write data. In the testing of such a memory, the expectation data generating part 16 is required to generate expectation data EXP that has, at bit positions currently masked with the mask data MD, the same bit data as that written previously but has currently written bit data at currently unmasked bit positions.

The expectation data generating part 16 is specifically designed to satisfy the required with ease. That is, the expectation data generating part 16 is made up of a logic inverter INV and an exclusive OR circuit EOR. The mask data MD is provided via the logic inverter INV to the one input terminal of the exclusive OR circuit EOR, and the pattern data TP from the pattern data generating part 15 is fed to the other input terminal of exclusive OR circuit EOR. The exclusive OR circuit EOR outputs exclusive ORs of corresponding bits of the two pieces of input data.

In the case of effecting a write in the memory under test 119 while masking with the mask data MD and reading out the results of the data written from the memory 119, the multiplexer 17 selects and outputs expectation data EXP generated in the expectation data generating part 16 by the inversion of a control signal EXP-S to, for example, a logic "1". This expectation data EXP is provided to the logic comparator 115.

In the mask data MD the mask bit (a write inhibit bit) has a logic "0" and the non-mask bit (a write enable bit) has a logic "1". Those bits of the mask data MD given the logic "0" are each inverted to "1" by the inverter INV in the expectation data generating part 16, and function as a signal for logic inversion of the corresponding bit in the pattern data TP. On the other hand, those bits given the logic "1" are each inverted to "0" by the inverter INV in the expectation data generating part 16, allowing the corresponding bit in the pattern data TP to be output intact at the logical level of its own. That is, in the expectation data generating part 16 the pattern data TP undergoes logic inversion at the bit positions corresponding to the mask bits of the mask data MD, thereafter being provided as the expectation data EXP.

In the case of writing "0s" in all bits (memory cells) of the memory under test 119 for initialization and then effecting a write therein by applying pattern data with all bits at the logic "1" level while masking alternate bits (alternate memory cells), the logic "1s" ought to be written in the memory cells of each address of the memory 119 corresponding to the unmasked bits, and the logic "0s" ought to be written in the memory cells corresponding to the masked bits. Accordingly, by inputting to the expectation data generating part 16 the pattern data TP with all bits at the logic level "1" and the mask data MD used for bit-wise masking, it is possible to obtain the same data as that which ought to have been written as the expectation data EXP in the memory 119; hence, the expectation data generating part 16 can generate correct expectation data EXP.

FIG. 8 shows how the expectation data EXP is generated as described above. Incidentally, FIGS. 8 to 14 are tables prepared by the inventor of this application for explaining the write/read operation in the memory under test. Column A in FIG. 8 depicts how to effect the write in the memory under test for initialization. This example shows the case where, at a write address #0, all "1s" mask data which enables a write in all bits are provided and all "0s" pattern data TP is written.

Column B shows the state in which a write has been effected in the address #0 with alternate bits masked (hereinafter referred to as bit-wise masking). The mask data MD is data "10101010 . . . " with "1" and "0" alternating with each other. The pattern data TP is inverted to all "1s", and the inverted data is selected by the multiplexer 17 and written as the signal DT in the memory under test.

In the memory under test there is written the logic "1" in each memory cell corresponding to a bit of logic "1" in the mask data MD and there is stored the initially written logic "0" in each memory cell corresponding to the logic "0" of the mask data MD because the write therein is inhibited.

Column C in FIG. 8 shows the case where data RD, read out of the memory under test after effecting a write therein while masking, matches the expectation data EXP.

At the time of reading the memory, the mask data MD used for the write and the pattern data TP are fed to the expectation data generating part 16, generating expectation data EXP (eighth cell in column C of the FIG. 8 table). The mask data MD is, in this example, data in which "1" and "0" alternate with each other, and the pattern data TP is all "1s" data. Accordingly, the expectation data EXP, which is provided from the expectation data generating part 16 and selected by and output from the multiplexer 17, is data in which "1" and "0" alternate with each other as is the case with the mask data MD. This expectation data EXP matches data RD (the lowest cell in column C of the FIG. 8 table) that is read out of the memory under test, from which it will be understood that the expectation data can be generated correctly.

Incidentally, "Invalid" in FIG. 8 represents data that is not used. That is, it indicates that the mask data MD is not ever used in the readout of the memory under test in the FIG. 8 example. The same is true of FIGS. 11 and 13 as well.

The above is a method for generating the expectation data for the memory whose addresses have a one-to-one correspondence with externally accessed addresses. With the recent development of high-capacity, fast write/read memories, there has been proposed a burst-type memory wherein an externally input address is used as a start address to generate burst addresses which access specifically defined memory spaces one after another and external data is written in the burst address spaces and read out therefrom. Some burst-type memories are of such one in which each address has memory cells constituting plural bytes each composed of eight or nine bits and that possesses, unlike in the aforementioned memory, a function by which a write in all memory cells (consisting of plural bytes) of each burst address is controlled on a byte-wise basis with the corresponding bits of the input mask data (hereinafter referred to as byte-wise masked write function). Accordingly, one-bit mask data is used for each byte; for instance, in the burst-type memory described below which has memory cells of two bytes for each address, a write in the memory cells of two bytes is controlled using the mask data of two bits.

Turning next to FIG. 9, a description will be given of the general operation and the byte-wise masking function of a Direct Rambus DRAM that is one of the burst type memories. FIG. 9A depicts a clock signal CLOCK which is applied to the Direct Rambus DRAM; FIG. 9B depicts control pins COL0 to COL4 for inputting therethrough a start address signal, control signals for controlling write and read operations, mask data and so forth; and FIGS. 9C and 9D depicts data I/O pins DQA0 to DQA8 and DQB0 to DQB8 for inputting and outputting therethrough write data signals and readout data signals, respectively.

The control pins COL0 to COL4 are supplied with a control packet COLC for inputting control instructions, start addresses and so forth and a mask packet COLM for inputting mask data. The control packet COLC is input to the pins COL0 to COL4 as parallel data of a 5-bit width in this example, and if a signal that is applied to a predetermined one of the pins, for example, COL0, is S=1, the Direct Rambus DRAM recognizes that the data to be input to the pins COL0 to COL4 is the packet COLC for inputting a start address. The read and write operations are specified by control signals COP0 to COP3 contained in the packet COLC. The start address at this time is specified by control signals C0 to C5. Other control signals are required for device recognition and for bank specification, for instance, but since they are not particularly related to the present invention, no description will be given of them.

In the case of the mask packet COLM that is input to the pins COL0 to COL4, if the signal to be applied to, for example, the pin COL1 is M=1, the Direct Rambus DRAM recognizes that the input data is a packet for inputting mask data. The mask packet COLM contains twp pieces of mask data MA0 to MA7 and MB0 to MB7; two bits of two pieces of mask data MAn and MBn (where n=0, 1, . . . , 7) of each corresponding number represent mask data for controlling a two-byte write in each address.

The data I/O pins DQA0 to DQA8 and DQB0 to DQB8 are shown to be supplied with two pieces of parallel data DQA and DQB. The two pieces of parallel pattern data DQA and DQB are written in burst addresses #0 to #7 which are generated in the memory. In this example, data of eight addresses is input.

WA00 to WA80 and WB00 to WB80 forming the two pieces of parallel pattern data DQA and DQB are each parallel pattern data of one byte consisting of nine bits. The two pieces of parallel pattern data are arranged in time sequence and input as a sequence of parallel pattern data to the memory.

FIG. 10 shows the relationships between the burst addresses #0 to #7 and mask data MA0 to MA7, MB0 to MB7 and parallel pattern data that is written in each of the burst addresses #0 to #7. Depending on whether the two pieces of mask data MA0 and MB0 assigned to the burst address #0 are logic "1s" or "0s", it is decided whether the pieces of parallel pattern data WA00 to WA80 and WB00 to WB80 to be written in the burst address #0 are masked on a byte-wise basis.

That is, if the mask data MA0 is a logic "1", the parallel pattern data WA00 to WA80 is write-enabled, and if the mask data MB0 is a logic "0", the parallel pattern data WB00 to WB80 is write-inhibited. For the other burst addresses #1 to #7, too, the masking operation is similarly controlled, depending on the logical values of the mask data MA1 to MA7 and MB1 to MB7.

As described above, in the Direct Rambus DRAM the burst addresses are generated, then the pieces of parallel pattern data (WA00 to WA80, WB00 to WB80), (WA01 to WA81, WB01 to WB81) . . . externally input on a time-shared basis are sequentially written in the burst addresses, and the memory itself controls the write inhibit and the write enable according to the pieces of mask data MA0 to MA7 and MD0 to MB7 input to the control pins.

The conventional pattern generator has no awareness of the burst address; hence, in the case of testing this kind of memory, the conventional pattern generator cannot generate, for each burst address, expectation data from mask data and pattern data written in the memory under test.

To facilitate a better understanding of the invention, a brief description will be given of a byte-wise masked test (a test conducted while in masking on the byte-wise basis) of the Direct Rambus DRAM.

In FIGS. 11 to 14 there shown operating states of the pattern generator and the Direct Rambus DRAM when the memory was written while masking on the byte-wise basis and read out.

FIG. 11 shows the operating states of the pattern generator and the memory under test at the time of initialization. The address generating part 13 (see FIG. 7) of the pattern generator 112 generates XB=#0 (see FIG. 11) as a start address, and the mask data generating part 14 outputs, as the mask data MD, "FFFF" whose bits are all "1s" in the FIG. 11 example.

Incidentally, the address XB and the mask data MD from the pattern generator 112 are output in parallel form, but in the waveform formatter 114 the address XB and the mask data MD in parallel form are converted by a pin select function of the formatter 114 to the packets COLC and COLM depicted in FIG. 9.

To the data I/O pins DQA0 to DQA8 and DQB0 to DQB8 of the memory under test 119 are sequentially input pieces of initialization data PDx0 to PDx7 of eight consecutive addresses. The initialization data PDx0 corresponds to WA00 to WA80 and WB00 to WB80 depicted in FIGS. 8 and 9, and the data PDx1 corresponds to WA01 to WA81 and WB01 to WB81. Similarly, the other remaining pieces of data PDx2 to PDx7 also correspond to the pieces of parallel pattern data DQA and DQB shown in FIGS. 8 and 9.

FIG. 11 shows how the initialization pattern is generated in the byte-wise masked test. Accordingly, control data such as the address XB and the mask data MD output from the pattern generator 112 is converted by the waveform formatter 112 to the packet signals COLC and COLM, thereafter being fed to the memory under test 119. The pieces of parallel pattern data PDx0 to PDx7 are also provided in tact via the multiplexer 17 to the waveform formatter 114 and converted to waveforms that meet the specifications of the memory under test 119 for input thereto.

FIG. 12 depicts the state of the memory 119 after the initialization shown in FIG. 11. Since the mask data MD="FFFF", a write is enabled for all bytes, and in the memory 119 pieces of data PDL0 o PDL7 and PDU0 to PDU7 are written as initialization data in the burst addresses, respectively.

In this case, PDL0 to PDL7 and PDU0 to PDU7 respectively correspond to the parallel data WA00 to WA87 and WB00 to WB87 depicted in FIGS. 9 and 10. That is, PDL0 corresponds to the data WA00 to WA80 of the low-order one byte of the address #0, and PDU0 corresponds to the data WB00 to WB80 of the high-order one byte of the address #0; the two-byte parallel pattern data of one address is shown as the low-order one-byte data and the high-order one-byte data.

FIG. 13 shows how to generate a byte-wise masked write pattern for the byte-wise masked test. In the byte-wise masking write, the pattern generator generates the start address XB=#0 and the parallel mask data MD. In the example of FIG. 13, data "AA55" (=1010101001010101) is set as the mask data MD. In this example, AA=10101010 is mask data for the low-order one byte of each of the burst addresses #0 to #7, and 55=01010101 is mask data for the high-order one byte of each of the burst addresses #0 to #7.

Parallel pattern data WDx0 to WDx7 is generated as a byte-wise masked write pattern for byte-wise masked test. As is the case with the parallel pattern data WDx0 to Wdx7 which forms the write pattern, the pieces of parallel pattern data are generated in the order WDx0 (WA00 to WA80, WB00 to WB80), WDx1 (WA01 to WA81, WB01 to WB81), . . . corresponding to the burst addresses #0 to #7, respectively. These pieces of parallel pattern data WDx0, WDx1, WDx2, WDx3, . . . , which form the write pattern, are provided intact as the signal DT to the memory under test.

The table of FIG. 14 shows stored contents of the memory under test after effecting the write therein while masking on the byte-wise basis. The mask data MA0 to MA7 on the first row in the table is mask data 55=01010101 for the low-order one byte of each of the addresses #0 to #7, and the mask data MB0 to MB7 on the second row is mask data AA=10101010 for the high-order one byte of each of the addresses #0 to #7. The one-byte parallel pattern data corresponding to the logic "1" bit of the mask data is write enabled. In this instance, at the DQA pin side (tile low-order one byte side) the pieces of the low-order one-byte data in the burst address #0, #2, #4 and #6 are changed to WDL0, WDL2, WDL4 and WDL6 written by the byte-wise masked write, while in the other burst addresses the initially written pieces of data PDL1, PDL3, PDL5 and PDL7 (see FIG. 12) are held unchanged. At the DQB pin side (the high-order one byte side), the pieces of high-order one-byte data in the burst addresses #1, #3, #5 and #7 are rewritten to WDU1, WDU3, WDU5 and WDU7, while in the other burst addresses the initially written pieces of data PDU0, PDU2, PDU4 and PDU6 are held unchanged.

As described above, when data written in the memory under test with memory cells masked on the byte-wise basis is read out of the memory and compared with the expectation data, the pieces of mask data MD (MA0 to MA7, MB0 to MB7) are provided in parallel signal form from the pattern generator 112 and are arranged irrespectively of the burst addresses; therefore, it is impossible, with the configuration of the pattern generator 112 shown in FIG. 5, to generate the expectation datas "WDL0PDU0", "PDL1WDU1", . . . ; "PDL7WDU7" in the FIG. 14 table from the parallel pattern data WD×0 to WD×7 and the parallel signal type mask data.

SUMMARY OF THE INVENTION

It is therefore an object of the present invention to provide a pattern generating method for use in testing such Direct Rambus DRAMs as mentioned above, a pattern generator utilizing the pattern generating method, and a memory tester using the pattern generator.

According to the present invention, there is provided a pattern generator for a memory tester which writes pattern data in a memory under test, then reads out thereof the written pattern data, and compares the read-out data with expectation data, the pattern generator comprising:

address generating means for generating a sequence of addresses to be applied to the memory under test;

pattern data generating means for generating parallel pattern data in which pieces of parallel data of plural bytes to be written, on a byte-wise basis, in memory cells of the memory under test specified by the addresses are arranged in time sequence in the order of burst addresses that are generated in the memory under test;

mask data generating means for generating parallel mask data which masks, on a byte-wise basis, plural-byte parallel data of the parallel pattern data generated by the pattern data generating means;

burst address generating means for generating, based on the address generated by the address generating means, burst addresses equivalent to burst addresses which are generated in the memory under test;

parallel-serial converting means for converting the parallel mask data from the mask data generating means to plural pieces of serial mask data in accordance with the burst addresses generated by the burst address generating means; and expectation data generating means for deciding, based on the logic of each bit of the plural pieces of serial mask data, whether each byte of the plural-byte parallel data is write-enabled, and for generating, based on the decision result, parallel expectation data of plural bytes from the plural-byte parallel data and initialization data of the memory under test.

The memory tester according to the present invention comprises:

the pattern generator;

a waveform formatter supplied with parallel pattern data generated by the pattern generator on a byte-wise basis and parallel mask data, for supplying a memory under test with a test pattern signal of a waveform satisfying the specifications of the memory under test and a mask signal converted to a signal satisfying the specifications of the memory under test;

a logic comparator for making logic comparison between read-out data read out of the memory under test and expectation data generated by the expectation data generating part.

According to the present invention, there is provided a pattern generating method for a memory tester which writes pattern data in a memory under test, then reads out thereof the written pattern data, and compares the read-out data with expectation data, the pattern generating method comprising the steps of:

(a) initializing a burst type memory under test with initialization data;

(b) providing an address, pattern data and mask data to the memory under test to effect therein a byte-wise masked write of said pattern data;

(c) converting parallel mask data to plural pieces of serial mask data in accordance with burst addresses generated in a burst address generating part; and (d) deciding, based on the logical value of each bit in each sequence of said serial mask data, whether data of each byte is write-enabled in a byte-wise masked write, and selecting, based on the decision result, either one of the initialization data and the byte-wise masked written pattern data on a byte-wise basis, thereby generating expectation data.

With the pattern generating method and the pattern generator of the present invention: burst addresses are generated at the pattern generator side; parallel mask data from the pattern generator is plural sequences of serial signals in accordance with the burst addresses; based on the logical value of each bit of the serial mask data, it is decided whether data of each byte is write-enabled in a byte-wise masked write; and, based on the decision result, either one of initialization data and the byte-wise masked written pattern data is selected on a byte-wise basis to thereby generate expectation data. Hence, correct expectation data can be generated with about the same configuration as in the past.

BRIEF DESCRIPTION OF THE DRAWINGS

FIG. 2 is a block diagram for explaining an example of a parallel-serial converting part used in the FIG. 1 embodiment;

FIG. 3 is a diagram for explaining the operation of the pattern generator depicted in FIG. 1;

FIG. 8 is a diagram for explaining a method for generating expectation data in the conventional pattern generator;

FIG. 10 is a diagram for explaining the relationship between the write data, mask data and burst addresses shown in FIG. 9;

FIG. 11 is a diagram for explaining the form of an initialization pattern for byte-wise masked test of the memory which performs the burst operation;

FIG. 12 is a diagram for explaining the state of a memory at the time of initialization for byte-wise masked test of the memory which performs the burst operation;

FIG. 13 is a diagram for explaining the generation of a byte-wise masked write pattern for the memory which performs the burst operation; and FIG. 14 is a diagram for explaining the state of the burst-operating memory at the time of byte-wise masked write therein.

DETAILED DESCRIPTION OF THE PREFERRED EMBODIMENTS

Figure 1:
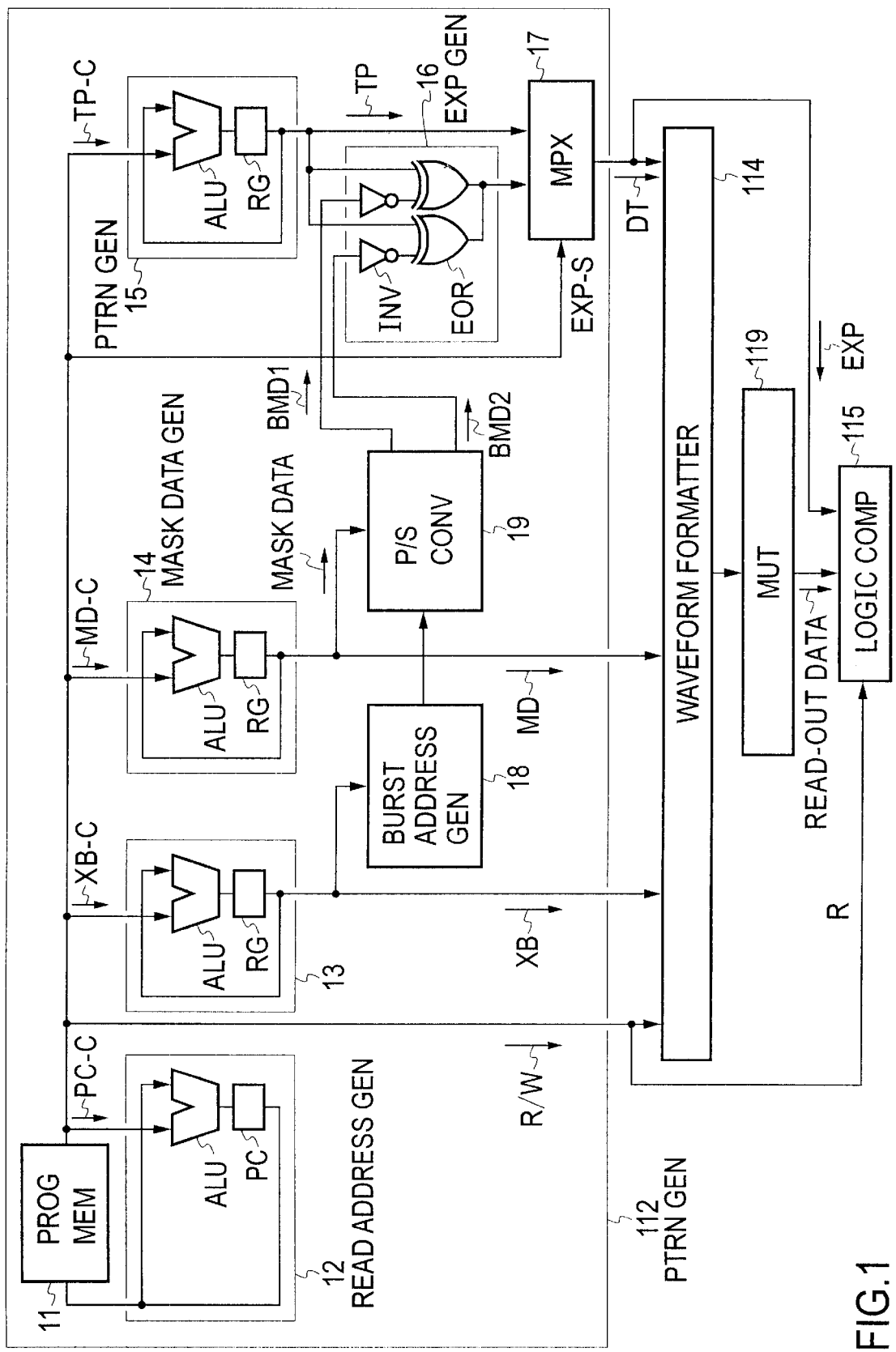
FIG. 1 is a block diagram for explaining the operation of an embodiment of the pattern generator according to the present invention.
Figure 7:
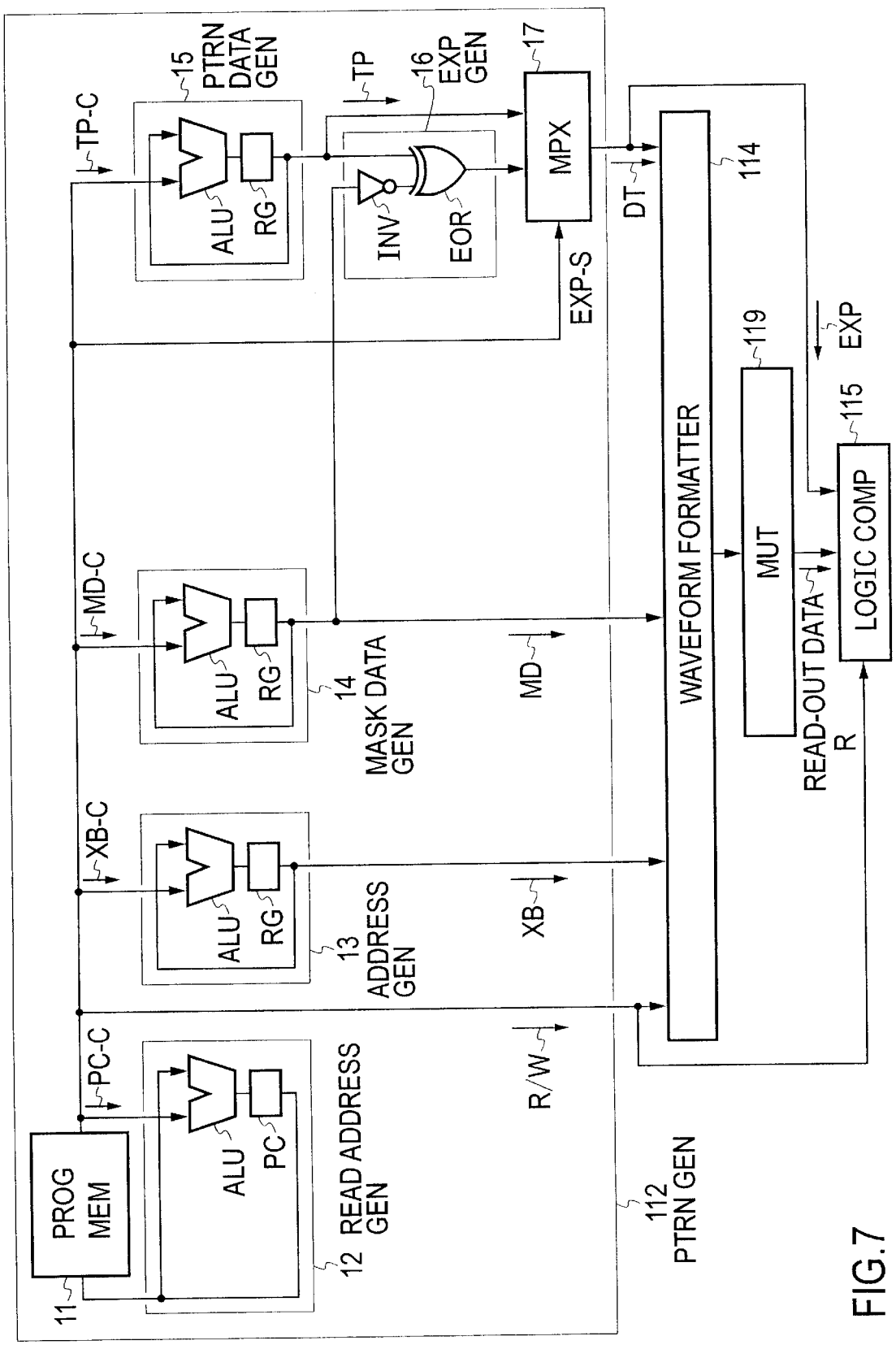
FIG. 7 is a block diagram for explaining the configuration and operation of a pattern generator used in the conventional memory tester.

FIG. 1 illustrates in block form an embodiment of the pattern generator according to the present invention. In FIG. 1 the parts corresponding to those in FIG. 7 are identified by the same reference numerals, and no description will be repeated. The pattern generator of the present invention features the additional provision of a burst address generating part 18 and a parallel-serial converting part 18 in the pattern generator 112 depicted in FIG. 7.

The burst address generating part 18 extracts, for example, a three-bit burst address portion added to the low-order bits side of an address XB generated in the address generating part 13, and uses the extracted burst address portion to generate the burst addresses #0 to #7.

The burst addresses #0 to #7 generated in the burst address generating part 18 are provided to the parallel-serial converting part 19, wherein mask data of the parallel signal type, generated in the mask data generating part 14, is converted to two serial signal type sequences of mask data BMD1 and BMD2 for each of the burst addresses #0 to #7.

Figure 9:
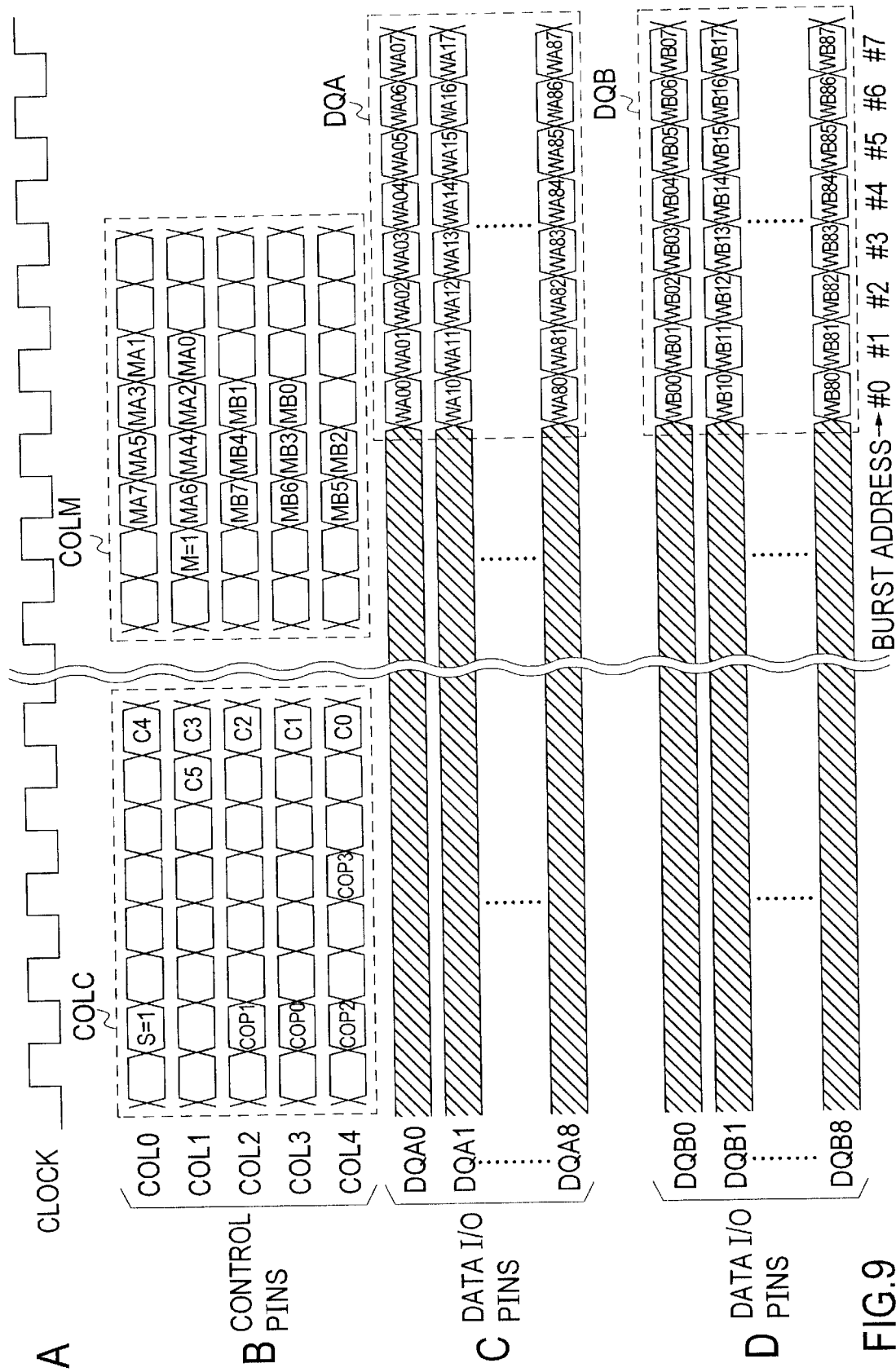
FIG. 9 is a timing chart for explaining forms of control signals and write data that are provided to a newly developed memory which performs a burst operation.

This example will also be described in connection with the case where two nine-bit one-byte pieces of parallel pattern data (WA00 to WA80, WB00 to WB80) are written in each of the data I/O pins DQA0 to DQA8 and DQB0 to DQB8 in units of two bytes for each burst address #n (where n=0, 1, ..., 7) as described previously in respect of FIG. 9. In the memory under test, the two-byte pieces of parallel pattern data (WA00 to WA80, WB00 to WB80) supplied to the data I/O pins DQA0 to DQA8 and DQB0 to DQB8 are written while being each controlled to be masked or not on the byte-by-byte basis. Accordingly, the pattern generator 112 also generates one bit of each of the two pieces of serial mask data BMD1 and BMD2 for each of the burst addresses #0 to #7. That is, the two pieces of parallel mask data MA0 to MA7 and MB0 to MB7 in the mask packet COLM in FIG. 9 are converted to two one-bit serial byte-wise mask data BMD1 and BMD2.

FIG. 2 depicts an example of the parallel-serial converting part 19. The illustrated example comprises: selectors 19A and 19B, each provided with eight input terminals X0 to X7; 8 by 2 bit selectors DS1-0 to DS1-7, DS2-0 to DS2-7 connected to the input terminals X0 to X7 of the selectors 19A and 19B, respectively; and registers RG1-0 to RG1-7 and RG2-0 to RG2-7 for setting which bit data is selected by each of the bit selectors DS1-0 to DS1-7 and DS2-0 to DS2-7.

The bit selectors DS1-0 to DS1-7 and DS2-0 to DS2-7 are each provided with 16 input terminals J0 to J15, to each of which is input one piece of 16-bit parallel mask data MA0 to MA7 and MB0 to MB7. That is, the respective pieces of parallel mask data MA0 to MA7 (see FIGS. 9 and 10) are input to the input terminals J0 to J7, and the respective pieces of parallel mask data MB0 to MB7 are input to the input terminals J8 to J15.

In the registers RG1-0 to RG1-7 and RG2-0 to RG2-7 are stored set values for determining which bits are selected and output by the bit selectors DS1-0 to DS1-7 and DS2-0 to DS2-7, respectively. For example, by setting "0000", "0001", ..., "0111" in the registers RG1-0 to RG1-7, the bit selectors DS1-0 to DS1-7 select and output the mask data MA0, MA1, ..., MA7. Similarly, by setting "1000", "1001", ..., "1111" in the registers RG2-0 to RG2-7, the bit selectors DS2-0 to DS2-7 select and output the mask data MB0, MB1, ..., MB7. A suitable selection of the values to be set in the registers RG1-0 to RG1-7 and RG2-0 to RG2-7 enables the bit selectors DS1-0 to DS1-7 and DS2-0 to DS2-7 to select and output arbitrary mask data.

Upon each input of the burst address from #0 to #7, the selectors 19A and 19B select the input terminals X0 to X7 by sequentially switching them. That is, the selectors each repeat selecting the input X0 the burst address #0, the input terminal X1 for the burst address #1 and the input X2 for the burst address #2.

Accordingly, each time the burst address steps by one from #0 to #7, th selectors 19A and 19B select any one of the 16 bits of parallel mask data MA0 to MA7 and any one of the 16 bits of parallel data MB0 t MB7 selected by the bit selectors DS1-0 to DS1-7 and DS2-0 to DS2-7, and output the two pieces of serial mask data BMD1 and MBD2, respectively.

The two pieces of serial mask data BMD1 and BMD2 output from the parallel-serial converting part 19 are fed to the expectation data generating part 16. In FIG. 1 the expectation data generating part 16 outputs 18-bit pattern data TP, but in this example, the high-order nine bits and the low-order nine bits are divided to two one-byte pattern data, the pattern data WDU0 to WDU7 of the one byte and the pattern data WDL0 to WDL7 of the other byte are each provided to the one input of one of two exclusive OR circuits EOR forming the expectation data generating part 16.

The two pieces of serial mask data MBD1 and BMD2 are each provided via the inverter INV to the other input terminal of the exclusive OR circuit EOR. Each exclusive OR circuit EOR calculates the exclusive ORs of the one-bit input from the inverter INV and respective bits of the parallel nine-bit (one byte) pattern data, outputting calculation results of nine bits.

With such an arrangement, the high-order one-byte pattern data WDU0 to WDU7 and the low-order one-byte pattern data WDL0 to WDL7, which are provided from the pattern data generating part 15, are controlled by the logical value of each bit of the two pieces of serial mask data BMD2 and BMD1 as to whether they are inverted or not; and the expectation data is generated in the expectation data generating part 16 in the same way as described previously with reference to FIG. 7. That is, the logical value of each bit of the two serial mask data BMD2 and BMD1 represents whether the pattern data has been write-inhibited by the mask data. If inhibited, the pattern data is inverted by the exclusive EOR to obtain initialization data, which is output as expectation data; and if not inhibited, the pattern data is output intact as expectation data.

FIG. 3 shows how the expectation data are generated in the case where: mask data with all bits "1s" and pattern data /WD×0 to /WD×7 (where the symbol "/" indicates logical inversion) are generated; then the pieces of pattern data /WD×0 to /WD×7 are written in the burst addresses #0 to #7 for initialization; then "AA55" and the data WD×0 to WD×7 are generated as mask data and pattern data, respectively; then the pieces of pattern data WD×0 to WD×7 are written in the burst addresses #0 to #7 while masking with the mask data "AA55"; and the written pattern data is read out.

This write operation differs from the conventional method described previously with respect to FIGS. 11 to 14 only in the substitution of the initialization data PDx0 to PDx7 with /WDx0 to /WDx7. That is, the memory under test after the above-mentioned write operation has such stored contents that PDU0, PDU2, PDU4, PDU6 are replaced with /WDU0, /WDU2, /WDU4, /WDU6 and PDL1, PDL3, PDL5, PDL7 with /WDL1, /WDL3, /WDL5, /WDL7 in FIG. 14.

In the generation of the expectation data at the time of reading out the written pattern data, "AA55" is generated as the mask data MD as in the case of writing the pattern data. This mask data MD is converted by the parallel-serial converting part 19 in FIG. 1 to two pieces of serial signal mask data BMD1=(MA0, MA1, . . . , MA7)="AA"= "10101010" and BMD2=(MB0, MB1, . . . , MB7)="55"= "01010101" in time sequence in accordance with the burst addresses.

The two pieces of serial signal mask data BMD1 and BMD2, which change every cycle with the burst address, are provided to the inverters INV and the exclusive OR circuits EOR. In the cycle of the burst address #0 in FIG. 3, since BMD1=1 and BMD2=0, WDL0 is output intact as the expectation data EXP for the low-order one byte and /WDU0 is output as the expectation data for the high-order one byte. In the cycle of the burst address #1, since the mask data BMD1 is "0" and BMD2 is "1", /WDL1 inverted from the low-order one byte WDL1 of the write data WDx1 is generated as the expectation data for the low-order side, and the high-order one byte WDU1 is generated intact as the expectation data. In this way, correct expectation data can be generated for each burst address in accordance with the logical values of the two pieces of mask data BMD1 and BMD2.

The above description has been given of the case where the Direct Rambus DRAM under test has memory cells of two bytes for each address. In the case of a Direct Rambus DRAM which has m-byte (where m is an integer equal to or greater than 2) memory cells for each address, the expectation data generating part 16 is formed using m exclusive OR circuits and m inverters INV, and in order to perform byte-wise masking control for the m-byte memory cells, parallel mask data is converted to m sequences of serial mask data, and the corresponding m bits of these m sequences of serial mask data are used to control whether to invert the m-byte pattern data.

Figure 4:
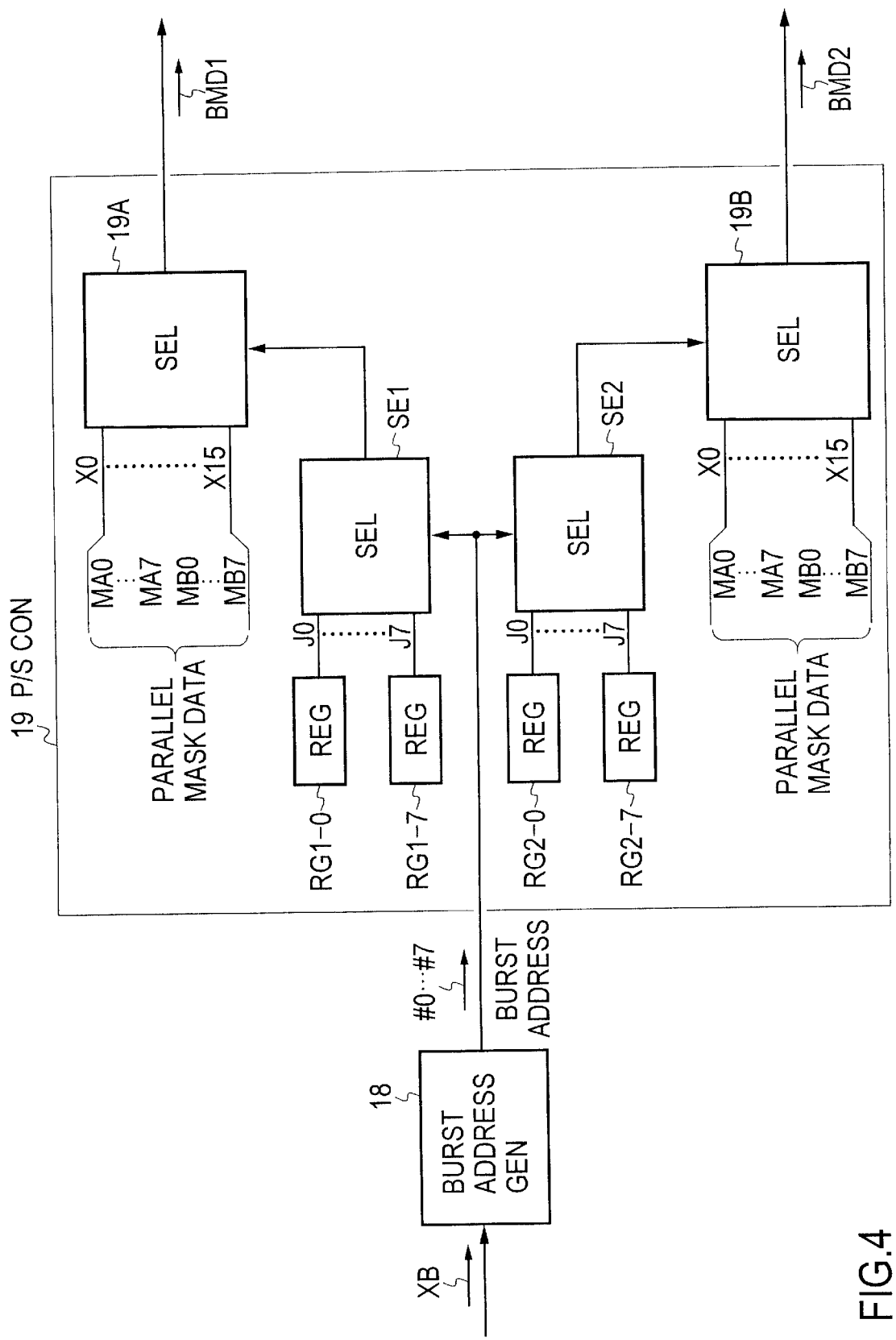
FIG. 4 is a block diagram for explaining a modified form of the parallel-serial converter shown in FIG. 2.

FIG. 4 illustrates in block form another embodiment of the parallel-serial converting part 19. The parallel-serial converting part 19 of this example comprises: two selectors 19A and 19B each having 16 input terminals X0 to X1; two selectors SE1 and SE2 each having eight input terminals J0 to J7; and 8 by 2 registers RG1-0 to RG1-7 and RG2-0 to RG2-7 connected to the input terminals J0 to J7 of the two selectors SE1 and SE2, respectively.

In the registers RG1-0 to RG1-7 and RG2-0 to RG2-7 are set bit select values. The selectors SE1 and SE2 select the bit select values in the registers RG1-0 to RG1-7 and RG2-0 to RG2-7 in a sequential order as the burst address changes from #0 to #7 one by one, and input the selected values to the selectors 19A and 19B, respectively. Based on the bit select values thus provided thereto, the selectors 19A and 19B each select and output the one-bit piece of data at any one of the input terminals X0 to X15.

For example, in the case where "0000" to "0111" are set in the registers RG1-0 to RG1-7 and "1000" to "1111" in the registers RG2-0 to RG2-7, the selector 19A selects any one of the pieces of eight-bit parallel mask data MA0 to MA7 provided to, for example, the input terminals X0 to X7, and the selector 19B selects any one of the pieces of eight-bit parallel mask data MB0 to MB7 provided to the input terminals X8 to X15. Thus, the selectors 19A and 19B output the selected mask data as the serial signals BMD1 and BMD2, respectively.

With the parallel-serial converting part 19, too, the two pieces of mask data MA0 to MA7 and MB0 to MB7 are converted to two sequences of serial mask data BMD1 and BMD2 in accordance with the change of the burst address from #0 to #7, and correct expectation data cane be generated from these two sequences of serial mask data BMD1 and BMD2.

Figure 5:
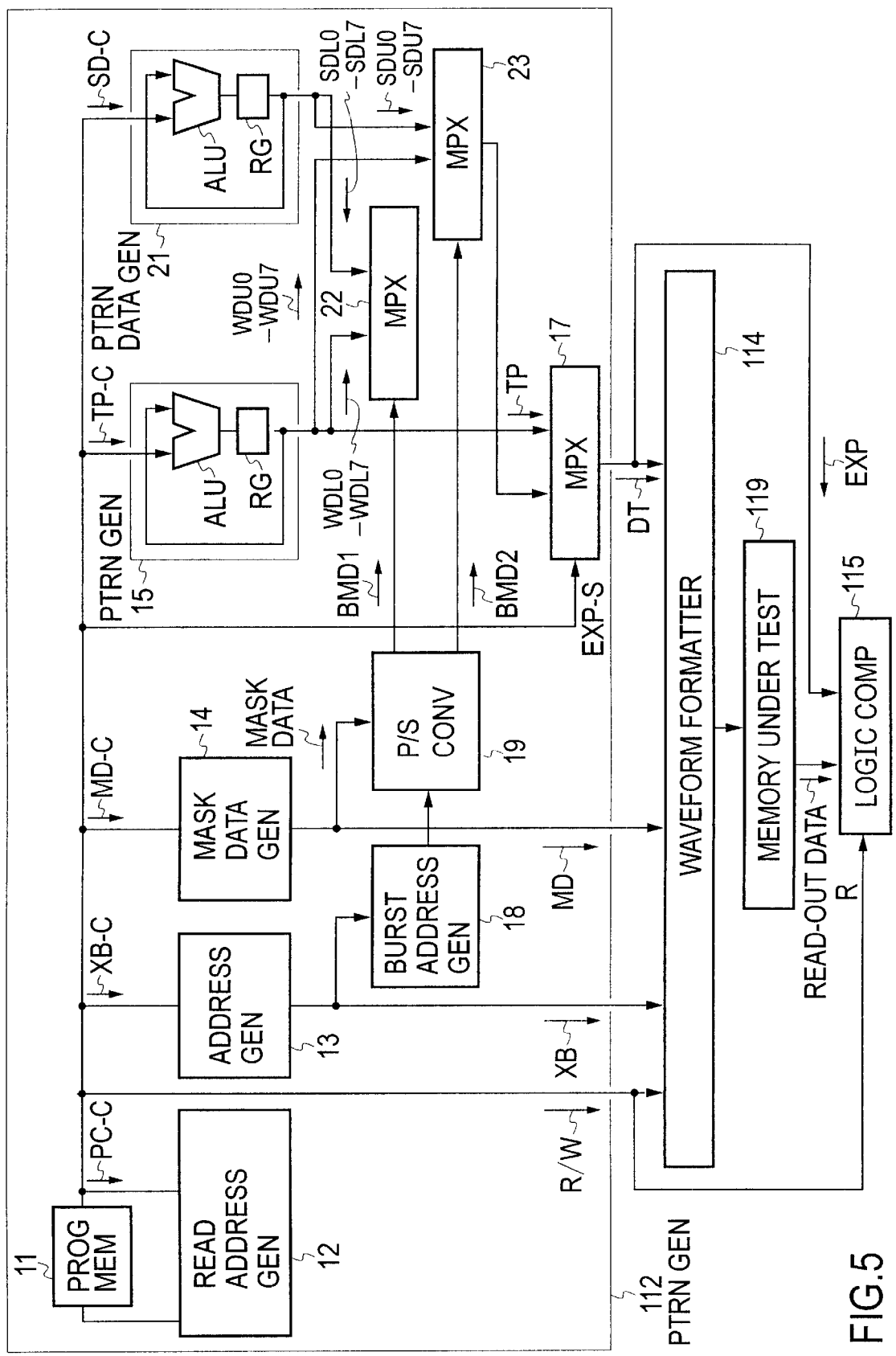
FIG. 5 is a block diagram for explaining another embodiment of the pattern generator according to the present invention.
Figure 6:
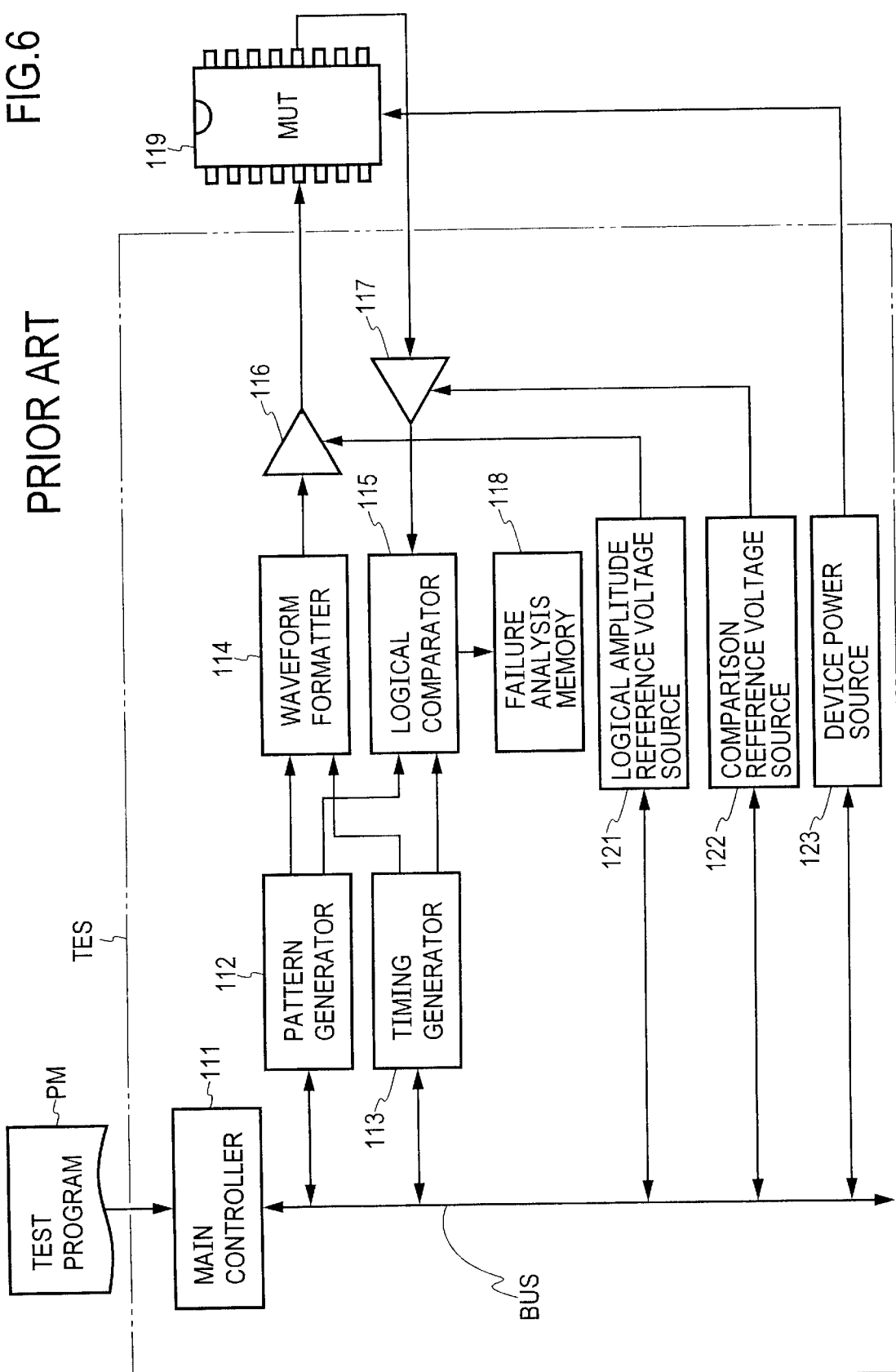
FIG. 6 is a block diagram for explaining the general configuration of a conventional memory tester.

FIG. 5 illustrates in block form another embodiment of the pattern generator according to the present invention. In this embodiment there is provided, separately of the pattern data generating part 15, an initialization data generating part 21 of the same configuration as that of the pattern data generating part 15, by which are generated two pieces of initialization data SDL0 to SDL7 and SDU0 to SDU7 that are written in the memory under test 119 at the beginning of its byte-wise masked test.

After the initialization, the parallel mask data MA0 to MA7, MB0 to MB7 and the parallel pattern data WDL0 to WDL7, WDU0 to WDU7 are output from the mask data generating part 14 and the pattern data generating part 15, and the pattern data is written in the memory under test 119 in accordance with he parallel mask data.

Thereafter, the two sequences of parallel mask data MA0 to MA7 and MB0 to MB7 are input to the parallel-serial converting part 19 for conversion into the two pieces of serial mask data BMD1 and BMD2. These pieces of serial mask data BMD1 and BMD2 are used to control the switching of multiplexers 22 and 23. When the mask data BMD1 provided thereto as a control signals is a logic "1", the multiplexer 22 is switched to the pattern data generating part 15, then selects and outputs the corresponding byte in the parallel pattern data WDL0 to WDL7 output from the pattern data generating part 15 as the byte of the expectation data on the low-order side of the pattern data write-enabled after initialization. When the mask data BMD2 provided thereto as a control signals is a logic "1", the multiplexer 23 is also switched to the pattern data generating part 15, then selects and outputs the corresponding byte in the parallel pattern data WDU0 to WDU7 output from the pattern data generating part 15 as the byte of the expectation data on the high-order side of the pattern data write-enabled after initialization.

When the mask data BMD1 is a logic. "0", the multiplexer 22 is switched to the initialization data generating part 21, then selects and outputs the corresponding byte in the initialization data SDU0 to SDU7 from the initialization data generating part 21 as the byte of the expectation data on the high-order side of the pattern data write-inhibited after initialization. When the mask data BMD2 is a logic "0", the multiplexer 23 is also switched to the initialization data generating part 21, then selects and outputs the corresponding byte in the initialization data SDU0 to SDU7 from the initialization data generating part 21 as the byte of the expectation data on the high-order side of the pattern data write-inhibited after initialization.

Hence, according to this embodiment, the two pieces of initialization data SDL0 to SDL7 and SDU0 to SDU7 need not always be such patterns data that all bits are logic "0s" or "1s", and even if the pattern that is written after initialization is not the pattern inverted from the initialization data, the expectation data can be generated with accuracy.

Moreover, in the memory testers using the pattern generators 112 depicted in FIGS. 1 and 5, correct expectation data can be generated for memories of the type generating burst addresses therein, making it possible to test Direct Rambus DRAMs.

EFFECT OF THE INVENTION

As described above, according to the present invention, burst addresses are generated at the pattern generator side, then parallel mask data is converted to serial mask data in accordance with the burst addresses, and the logic of pattern data is controlled in accordance with the logical value of the serial mask data, or either one of initialization data and data written after initialization is selected, by which it is possible to generate correct expectation data for each burst address. As a result, Direct Rambus DRAMs can easily be tested.

What is claimed is:

1. A pattern generator for a memory tester which writes pattern data in a memory under test, then reads out thereof the written pattern data, and compares the read-out data with expectation data, said pattern generator comprising:

address generating means for generating a sequence of addresses to be applied to said memory under test;

pattern data generating means for generating parallel pattern data in which pieces of parallel data of plural bytes to be written, on a byte-wise basis, in memory cells of said memory under test specified by said sequence of addresses are arranged in time sequence in the order of burst addresses that are generated in said memory under test;

mask data generating means for generating parallel mask data which masks, on a byte-wise basis, plural-byte parallel data of said parallel pattern data generated by said pattern data generating means;

burst address generating means for generating, based on said address generated by said address generating means, burst addresses equivalent to burst addresses which are generated in said memory under test;

parallel-serial converting means for converting said parallel mask data from said mask data generating means to plural pieces of serial mask data in accordance with said burst addresses generated by said burst address generating means; and expectation data generating means for deciding, based on the logic of each bit of said plural pieces of serial mask data, whether each byte of said plural-byte parallel data is write-enabled, and for generating, based on the decision result, parallel expectation data of plural bytes from said plural-byte parallel data and initialization data of said memory under test.

2. The pattern generator of claim 1, wherein said expectation data generating means includes logic circuit means for controlling whether logical values of plural-byte parallel pattern data generated by said pattern generating means are inverted on a byte-wise basis in accordance with the logical value of each bit of said plural pieces of serial mask data.

3. The pattern generator of claim 2, wherein said logic circuit means includes plural exclusive OR circuits each of which, when each bit of said plural pieces of serial mask data takes the one logical value, inverts the logical value of said parallel pattern data on a byte-wise basis and outputs said parallel pattern data and, when said each bit takes the other logical value, outputs the logical value of said parallel pattern data intact on a byte-wise basis.

4. The pattern generator of claim 1, wherein said expectation data generating means includes: initialization data generating means for generating initialization data to be written in said memory under test for initialization of a byte-wise masked test; and multiplexer means for generating expectation data by selecting either one of said plural-byte parallel data from said pattern data generating means and said plural-byte initialization data from said initialization data generating means in accordance with the logic of each bit of said plural pieces of serial mask data from said parallel-serial converting means.

5. The pattern generator of claim 4, wherein said expectation data generating means is a multiplexer which, when each bit of said plural pieces of serial mask data takes the one logical value, selects and outputs said parallel pattern data from said pattern data generating means and, when said each bit takes the other logical value, selects and outputs said initialization data from said initialization data generating means.

6. The pattern generator of any one of claims 1 to 5, wherein said burst address generating means is means for outputting, as said burst addresses, predetermined plural low-order bits of said address generated by said address generating means.

7. A memory tester comprising:

said pattern generator of claim 1;

a waveform formatter supplied with parallel pattern data generated by said pattern generator on a byte-wise basis and parallel mask data, for supplying a memory under test with a test pattern signal of a waveform satisfying the specifications of said memory under test and a mask signal converted to a signal satisfying the specifications of said memory under test; and a logic comparator for making logic comparison between read-out data read out of said memory under test and expectation data generated by said expectation generating means.

8. A pattern generating method for a memory tester which writes pattern data in a memory under test, then reads out thereof the written pattern data, and compares the read-out data with an expectation, said pattern generating method comprising the steps of:

(a) initializing a burst type memory under test with initialization data;

(b) providing an address, pattern data and mask data to said memory under test to effect therein a byte-wise masked write of said pattern data;

(c) converting parallel mask data to plural pieces of serial mask data in accordance with burst addresses generated in a burst address generating means; and (d) deciding, based on the logical value of each bit in each sequence of said serial mask data, whether data of each byte is write-enabled in the byte-wise masked write, and selecting, based on the decision result, either one of said initialization data and said byte-wise masked written pattern data on a byte-wise basis, thereby generating expectation data.

9. The pattern generating method of claim 8, wherein said step (d) includes a step of outputting the logical value of said parallel data after inverting it on a byte-wise basis or outputting the logical value of said parallel data intact on a byte-wise basis, depending on whether each bit of said plural pieces of serial mask data takes the one or the other logical value.

10. The pattern generating method of claim 8, wherein said step (d) includes steps of generating initialization data to be written in said memory under test for initialization of a byte-wise masked test; and generating expectation data by selecting either one of said plural-byte parallel pattern data and said plural-byte initialization data, depending on the logic of each bit of said plural pieces of serial mask data.

* * * * *